US009741531B2

United States Patent
Takeda et al.

(10) Patent No.: US 9,741,531 B2
(45) Date of Patent: Aug. 22, 2017

(54) CHARGED PARTICLE BEAM DEVICE ENABLING FACILITATED EBSD DETECTOR ANALYSIS OF DESIRED POSITION AND CONTROL METHOD THEREOF

(71) Applicant: Hitachi High-Technologies Corporation, Minato-ku, Tokyo (JP)

(72) Inventors: Kazuyuki Takeda, Tokyo (JP); Tohru Ando, Tokyo (JP); Tsutomu Saito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/905,170

(22) PCT Filed: May 21, 2014

(86) PCT No.: PCT/JP2014/063491
§ 371 (c)(1),
(2) Date: Jan. 14, 2016

(87) PCT Pub. No.: WO2015/011975
PCT Pub. Date: Jan. 29, 2015

(65) Prior Publication Data
US 2016/0163504 A1    Jun. 9, 2016

(30) Foreign Application Priority Data
Jul. 23, 2013  (JP) ................. 2013-153091

(51) Int. Cl.
*H01J 37/28* (2006.01)
*H01J 37/26* (2006.01)
*H01J 37/244* (2006.01)

(52) U.S. Cl.
CPC .......... *H01J 37/265* (2013.01); *H01J 37/244* (2013.01); *H01J 37/28* (2013.01);
(Continued)

(58) Field of Classification Search
CPC ........ H01J 37/28; H01J 37/3056; H01J 37/26; H01J 37/153; H01J 37/304; H01J 37/244;
(Continued)

(56) References Cited

U.S. PATENT DOCUMENTS 6,166,380 A * 12/2000 Kitagawa ................ H01J 37/28
                                                        250/307
7,858,936 B2 * 12/2010 Bray .................... G01R 31/307
                                                        250/306
(Continued)

FOREIGN PATENT DOCUMENTS

JP          10-40849 A    2/1998
JP       2000-277044 A   10/2000
(Continued)

OTHER PUBLICATIONS

International Search Report (PCT/ISA/210) issued in PCT Application No. PCT/JP2014/063491 dated Jun. 17, 2014 with English translation (four pages).
(Continued)

*Primary Examiner* — David A Vanore
(74) *Attorney, Agent, or Firm* — Crowell & Moring LLP (57) ABSTRACT

A charged particle beam device allowing an analysis position in a sample analyzable with an EBSD detector to be acquired beforehand, and allowing a sample to be adjusted to a desired analysis position in a short time. A charged particle beam device is provided with a charged particle source (111), a charged particle optical system (115), an EBSD detector (101), a sample stage (116), an image display unit (117) for displaying a portion of the sample observable with the EBSD detector and a non-observable portion of the sample such that said portions are distinguished from each other, an operation input unit (121) where a position to be observed by the EBSD detector is entered, and a control unit (118) for controlling a planar movement, an inclination
(Continued)

movement and a rotation movement of the sample stage so as to allow the observation position entered from the operation input unit to be observed with the EBSD detector.

25 Claims, 4 Drawing Sheets

(52) U.S. Cl.
CPC ............ *H01J 2237/20207* (2013.01); *H01J 2237/20221* (2013.01); *H01J 2237/24475* (2013.01); *H01J 2237/2804* (2013.01)

(58) Field of Classification Search
CPC ...... H01J 37/1478; H01J 37/21; H01J 37/252; H01J 37/261; H01J 37/3002; H01J 37/3005; H01J 37/3045; H01J 37/023; H01J 37/06; H01J 37/18; H01J 37/20; H01J 37/222; H01J 37/265; H01J 37/285; H01J 37/30; H01J 37/3023; H01J 37/3053; H01J 37/317; G01N 1/32; G01N 1/286; G01N 1/06; G01N 1/08; G01N 1/28; G01N 1/44; G01N 23/04; G01N 23/223; G01N 23/2251; G01N 23/2252; G01N 23/2257
USPC ..... 250/307, 310, 311, 440.11, 492.1, 492.2, 250/306, 309, 361 R, 370.11, 397, 250/492.21, 492.22, 492.3
See application file for complete search history.

(56) References Cited

U.S. PATENT DOCUMENTS

| 8,455,822 | B2* | 6/2013 | Rue | H01J 37/3005 250/309 |
| 8,502,172 | B1* | 8/2013 | Bugge | H01J 37/3045 250/492.1 |
| 8,581,188 | B2* | 11/2013 | Barbi | H01J 37/26 250/307 |
| 8,742,375 | B2* | 6/2014 | Kawasaki | H01J 37/28 250/310 |
| 2006/0284081 | A1* | 12/2006 | Miyamoto | H01J 37/28 250/307 |
| 2009/0242760 | A1* | 10/2009 | Miyamoto | G01N 23/2251 250/307 |
| 2011/0006207 | A1* | 1/2011 | Arjavac | G01N 1/32 250/307 |
| 2012/0112063 | A1* | 5/2012 | Schertel | G01N 1/32 250/307 |
| 2012/0132803 | A1* | 5/2012 | Hirato | H01J 37/28 250/310 |
| 2014/0217283 | A1* | 8/2014 | Blackwood | G01N 1/286 250/307 |
| 2014/0291511 | A1* | 10/2014 | Man | H01J 37/3002 250/307 |
| 2014/0341469 | A1* | 11/2014 | Hisaki | G06T 5/009 382/168 |
| 2016/0118216 | A1* | 4/2016 | Doemer | H01J 37/023 250/307 |
| 2016/0163504 | A1* | 6/2016 | Takeda | H01J 37/244 250/307 |

FOREIGN PATENT DOCUMENTS

| JP | 2007-179929 A | 7/2007 |
| JP | 2007-200573 A | 8/2007 |
| JP | 2010-198998 A | 9/2010 |

OTHER PUBLICATIONS

Japanese-language Written Opinion (PCT/ISA/237) issued in PCT Application No. PCT/JP2014/063491 dated Jun. 17, 2014 (three pages).
International Preliminary Report on Patentability (PCT/IB/338 & PCT/IB/373) issued in PCT Application No. PCT/JP2014/063491 dated Feb. 4, 2016, including English-translation (Japanese-language Written Opinion (PCT/ISA/237)) previously filed on Jan. 14, 2016 (five (5) pages).

\* cited by examiner

CHARGED PARTICLE BEAM DEVICE ENABLING FACILITATED EBSD DETECTOR ANALYSIS OF DESIRED POSITION AND CONTROL METHOD THEREOF

TECHNICAL FIELD

The present invention relates to a charged particle beam device, such as a scanning electron microscope, that is equipped with an EBSD detector, as well as a control method therefor.

BACKGROUND ART

An electron backscattered diffraction (EBSD) method is one example of a method for crystal structure analysis of a sample. This method may also be referred to as an electron backscattered diffraction pattern (EBSP) method.

An EBSD detector has a structure in which a fluorescent screen is disposed on the distal end of a high sensitivity camera, and is attached to a charged particle beam device or the like. When a charged particle beam is converged and irradiated on the surface of a sample, a diffraction image of backscattered electrons generated from the sample surface based on the crystal orientation thereof is projected onto the fluorescent screen. This diffraction image is detected by the high sensitivity camera to analyze the crystal orientation, crystal structure, and the like. Since the diffraction image of the backscattered electrons is projected onto the fluorescent screen, the EBSD detector is disposed extremely close to the side of the sample, for example up to about 1 cm therefrom.

PTL 1 discloses a technology for analyzing the crystal orientation, crystal structure, and the like with an EBSD detector. Therein, the analysis is conducted without tilting the sample stage by using a holder that is pre-tilted to 70 degrees.

PTL 2 is a publicly-known example of a technology for displaying a sample stage image in an electron microscope.

The technology disclosed in PTL 2 includes an imaging device that acquires the sample stage image. Using the sample stage image acquired by the imaging device, a sample image acquired by the electron microscope and position information on the sample stage are displayed on a display device using information regarding the correspondence relationship between the position, movement distance, and movement direction of the sample stage and the position, movement distance, and movement direction of the sample stage on the display device image.

CITATION LIST

Patent Literatures

PTL 1: JP 2000-277044 A
PTL 2: JP 2010-198998 A

SUMMARY OF INVENTION

Technical Problem

The present inventors discovered the following as a result of keen examination into an EBSD method that can be carried out easily and reliably by a beginner.

In a charged particle beam device, in order to efficiently detect a diffraction image of backscattered electrons generated from a sample surface with an EBSD detector upon irradiating the sample surface with a charged particle beam, it is necessary to tilt the sample on a sample table to approximately 70 degrees relative to a vertical line.

Therefore, the tilted sample table may interfere with or contact the EBSD detector and the members included in the charged particle beam optical system.

Further, since the sample is set on the sample table and then tilted to 70 degrees, the sample may escape from the field of view due to movement of the sample stage upon tilting, and searching for the field of view that includes the sample can be troublesome.

In addition, in an analysis method that uses a sample table specialized for EBSD which disposes the sample in a pre-tilted state, stage movement in the rotation direction of the sample is restricted, and thus there are cases in which the analysis portion originally intended to be analyzed cannot be analyzed.

Therefore, in sample analysis with an EBSD detector, it has not been easy, even for an experienced operator, to adjust the disposition of the sample so that the analysis portion can be analyzed, and such adjustments have taken an enormous amount of time. For example, even for an experienced operator, positional adjustment of the sample has required about 10 minutes, and if the sample escapes from the field of view as described above, even more time has been required to find the field of view which includes the sample.

An object of the present invention is to provide a charged particle beam device allowing an analysis portion in a sample that is analyzable with an EBSD detector to be ascertained beforehand, and allowing the sample to be adjusted to a desired analysis position in a short time.

Solution to Problem

For example, the present invention is a charged particle beam device including a charged particle source that emits a charged particle beam, a charged particle optical system that irradiates the charged particle beam on a sample, an EBSD detector that detects backscattered electron diffraction generated from a surface of the sample by irradiation of the charged particle beam, a sample stage that supports and moves a sample table on which the sample is disposed, an image display unit that displays a portion in the sample that is observable by the EBSD detector and a portion that is non-observable such that the portions are distinguishable, an operation input unit with which a position to be observed by the EBSD detector is input, a control unit that controls a planar movement, a tilt movement, and a rotational movement of the sample stage so as to allow the observation position input from the operation input unit to be observed by the EBSD detector.

In addition, for example, the present invention is a charged particle beam device including a charged particle source that emits a charged particle beam, a charged particle optical system that irradiates the charged particle beam on a sample, an EBSD detector that detects backscattered electron diffraction generated from a surface of the sample by irradiation of the charged particle beam, a sample stage that supports and moves a sample table on which the sample is disposed, an operation input unit with which a position to be observed by the EBSD detector is input, a control unit that controls a planar movement, a tilt movement, and a rotational movement of the sample stage so as to allow the observation position input from the operation input unit to be observed by the EBSD detector when the observation position is a portion that is observable by the EBSD detector, and an image display unit that displays that observation by the EBSD detector is not possible when the observation position input from the operation input unit is a portion that is non-observable by the EBSD detector.

In addition, for example, the present invention is a method for controlling a charged particle beam device that guides attachment of an EBSD detector to the charged particle beam device, including, calculating, by a control unit, a portion that is observable in a sample disposed on a sample table by the EBSD detector and a portion that is non-observable based on a size of the sample table supported on a sample stage, a tilt angle of the sample stage during use of the EBSD detector, and a range of planar movement, tilt movement, and rotational movement of the sample stage, controlling, by the control unit, the planar movement, tilt movement, and rotational movement of the sample stage so as to allow a position for observation by the EBSD detector input from an operation input unit to be observed by the EBSD detector when the observation position is the observable portion, displaying that the EBSD detector can be inserted on an image display unit after the planar movement, tilt movement, and rotational movement of the sample stage so as to allow the observation position to be observed by the EBSD detector.

Advantageous Effects of Invention

According to the invention, an observation portion in a sample that is observable with an EBSD detector can be ascertained beforehand, and the sample can be adjusted to a desired observation position in a short time.

DESCRIPTION OF EMBODIMENTS

Embodiments of the present invention will now be explained below referring to the attached drawings.

The embodiment discloses a charged particle beam device including a charged particle source that emits a charged particle beam, a charged particle optical system that irradiates the charged particle beam on a sample, an EBSD detector that detects backscattered electron diffraction generated from a surface of the sample by irradiation of the charged particle beam, a sample stage that supports and moves a sample table on which the sample is disposed, an image display unit that displays a portion in the sample that is analyzable by the EBSD detector and a portion that is non-analyzable such that the portions are distinguishable, an operation input unit with which a position to be analyzed by the EBSD detector is input, and a control unit that controls a planar movement, a tilt movement, and a rotational movement of the sample stage so as to allow the analysis position input from the operation input unit to be analyzed by the EBSD detector.

The embodiment also discloses a charged particle beam device including a charged particle source that emits a charged particle beam, a charged particle optical system that irradiates the charged particle beam on a sample, an EBSD detector that detects backscattered electron diffraction generated from a surface of the sample by irradiation of the charged particle beam, a sample stage that supports and moves a sample table on which the sample is disposed, an operation input unit with which a position to be analyzed by the EBSD detector is input, a control unit that controls a planar movement, a tilt movement, and a rotational movement of the sample stage so as to allow the analysis position input from the operation input unit to be analyzed by the EBSD detector when the analysis position is a portion that is analyzable by the EBSD detector, and an image display unit that displays that analysis by the EBSD detector is not possible when the analysis position input from the operation input unit is a portion that is non-analyzable by the EBSD detector.

The embodiment also discloses a method for controlling a charged particle beam device that guides attachment of an EBSD detector to the charged particle beam device, the method including calculating, by a control unit, a portion that is analyzable in a sample disposed on a sample table by the EBSD detector and a portion that is non-analyzable based on a size of the sample table supported on a sample stage, a tilt angle of the sample stage during use of the EBSD detector, and a range of planar movement, tilt movement, and rotational movement of the sample stage, controlling, by the control unit, the planar movement, tilt movement, and rotational movement of the sample stage so as to allow a position for analysis by the EBSD detector input from an operation input unit to be analyzed by the EBSD detector when the analysis position is the analyzable portion, displaying that the EBSD detector can be inserted on an image display unit after the planar movement, tilt movement, and rotational movement of the sample stage so as to allow the analysis position to be analyzed by the EBSD detector.

The embodiment discloses a program for a charged particle beam device that guides the attachment of an EBSD detector to the charged particle beam device. The program causes a control unit to calculate a portion in a sample disposed on a sample table that is analyzable by an EBSD detector and a portion that is non-analyzable based on the size of the sample table supported by a sample stage, a tilt angle of the sample stage during use of the EBSD detector, and a range of planar movement, tilt movement, and rotational movement of the sample stage. When a position for analysis by the EBSD detector that was input from an operation input unit is an analyzable portion, the program causes the control unit to control the planar movement, tilt movement, and rotational movement of the sample stage so that the analysis position can be analyzed by the EBSD detector. After the sample stage has undergone planar movement, tilt movement, and rotational movement so that the analysis position can be analyzed by the EBSD detector, the program causes an image display unit to display that the EBSD detector can be inserted.

The embodiment discloses that the image display unit displays a portion in the sample that is analyzable by the EBSD detector and a portion that is non-analyzable such that the portions are distinguishable. The embodiment also discloses that the image display unit displays a portion that is non-analyzable by the EBSD detector due to tilt movement of the sample stage and a portion that is non-analyzable by the EBSD detector due to being outside a movement range of the sample stage such that the portions are distinguishable.

The embodiment discloses that the image display unit displays that analysis by the EBSD detector is not possible when the analysis position input from the operation input unit is a portion that is non-analyzable by the EBSD detector.

The embodiment discloses that the image display unit displays that the EBSD detector can be inserted after the sample stage has moved so as to allow analysis by the EBSD detector.

The embodiment discloses that the charged particle beam device includes an imaging device that images the sample, and the image display unit combines and displays the analyzable portion and the non-analyzable portion with an image obtained by the imaging device.

The embodiment discloses that the image display unit displays, before movement of the sample stage, a pseudo image showing a case in which the sample stage has been moved in accordance with the analysis position input from the operation input unit. The embodiment also discloses that a positional relationship among a charged particle beam optical system, the EBSD detector, and the sample table is displayed in the pseudo image. The embodiment further discloses that the operation input unit can readjust the analysis position after the pseudo image has been displayed on the image display unit. The embodiment also discloses that a position to be analyzed by the EBSD detector can be re-input from the operation input unit after the pseudo image has been displayed on the image display unit. The embodiment further discloses that the charged particle beam device includes an imaging device that images the sample, and the image display unit combines and displays the image obtained by the imaging device with the pseudo image.

Hereinafter, a scanning electron microscope will be explained as one example of the charged particle beam device. However, the present invention is not limited thereto, and the present invention can also be applied to, for example, a scanning ion microscope, a scanning transmission electron microscope, and a composite device combining such microscopes with a sample processing device, as well as an analysis/scanning device utilizing such microscopes/devices. The present invention can be applied to any observation device that is capable of tilting the sample.

Embodiment

Figure 1:
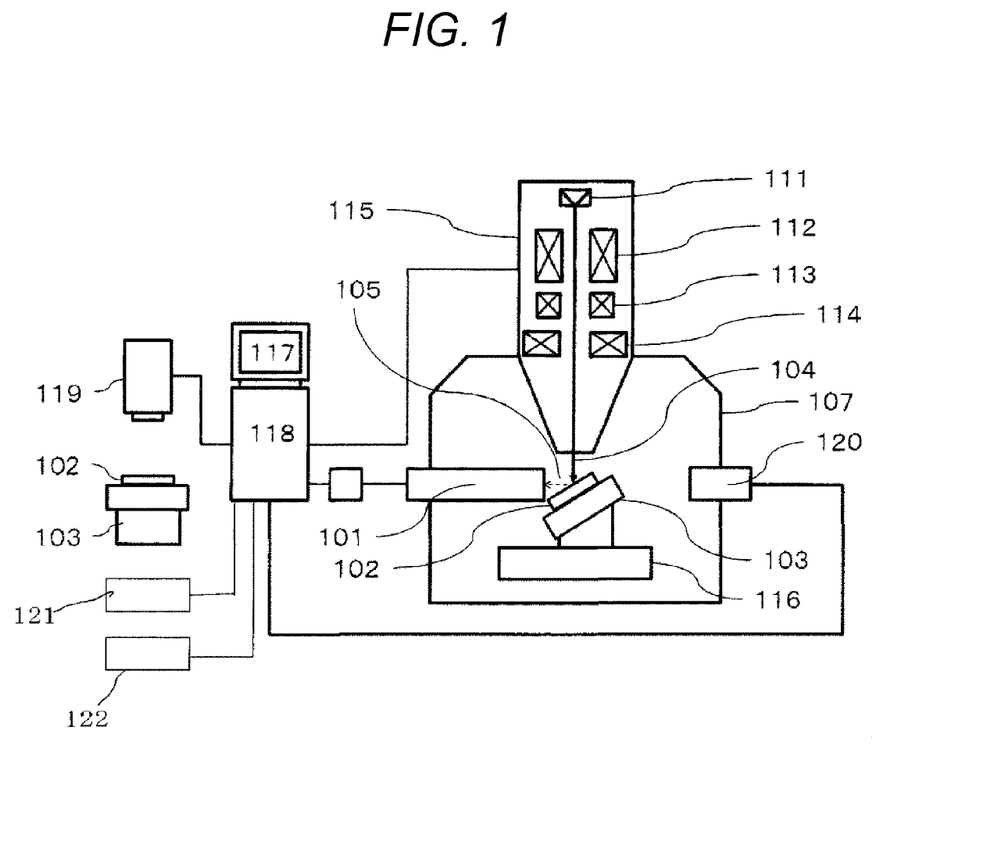
FIG. 1 is a schematic view of the overall structure of a charged particle beam device.

FIG. 1 is a schematic structural view of a scanning electron microscope according to the present embodiment.

In FIG. 1, a thin piece sample 102 is adhered and disposed on a sample table 103 before putting the sample into a vacuum chamber 107. The sample table 103 and the sample 102 are observed beforehand with a CCD camera 119 to confirm an analysis position. Besides a CCD camera, any device that can perform image capture at a magnification such that an image of the entire sample table 103 can be captured is acceptable.

At this time, the sample table 103 is mounted on an attachment table that is provided in an imaging direction of the CCD camera 119. The attachment table is made such that the center of the sample table 103 and the center of the CCD camera 119 line up with each other when the sample table 103 is mounted. An attachment table having the same shape as the above-mentioned attachment table is also installed within the vacuum chamber 107 of the charged particle beam device, and this attachment table is adjusted to match an optical axis of the charged particle beam.

By attaching the sample 102 together with the sample table 103 to the attachment table within the vacuum chamber 107 after determining the orientation of the sample table 103 by observation with the CCD camera 119, the sample 102 can be observed centered on the same position and at the same orientation both when observing the sample table 103 and the sample 102 with the CCD camera 119 and when observing the sample table 103 and the sample 102 with the charged particle beam device upon inserting them into the vacuum chamber 107.

A primary charged particle beam 104 is generated from an electron gun 111 within the vacuum chamber 107. The primary charged particle beam 104 is condensed by a condenser lens 112 and passed through a diaphragm.

The primary charged particle beam 104 is deflected by a scan deflector 113 and an image shift deflector. A range, direction, and speed with which the scan deflector 113 scans the primary charged particle beam 104 can be controlled by a control computer 118.

The primary charged particle beam 104 is condensed and irradiated on the sample 102 by an objective lens 114. Secondary particles 105 such as secondary electrons or reflected electrons obtained by irradiation of the primary charged particle beam 104 are detected by a detector 101. A charged particle optical system 115 includes the electron gun, the condenser lens, the diaphragm, the scan deflector, the image shift deflector, the objective lens, and the detector. However, the charged particle optical system 115 may include other lenses, electrodes, and detectors therein. Further, portions may differ from those members described above, and the charged particle optical system is not limited to the constitution described above. For example, there are cases in which there is only one condenser lens. A vacuum pump is connected to the charged particle optical system, and thereby a passage route of the charged particle beam 104 is evacuated to a predetermined vacuum degree. The operation of the vacuum pump is controlled by the control computer 118.

An image generation unit included in the control computer 118 generates pixels upon associating a signal from the detector 101 with an irradiation position of the primary charged particle beam 104, and thereby generates a charged particle image and displays this image on a display device 117. The display device 117 can also display a tilt state and orientation of the sample 102 using a pseudo image to be explained below. The control computer 118 also includes a control unit for controlling the overall device, such as the movement of a sample stage 116 that supports the sample table 103, switching of the magnification and the like. The control unit and the image generation unit can also be constituted by hardware using a dedicated circuit board, and can also be constituted by a program executed by a generic computer connected to the charged particle beam device. The connections between these devices, circuits, and computers can be wired or wireless. Further, the control computer 118 can also perform other operations in addition to those described above.

The control computer 118 is connected to an operation input unit 121 with which an operator's instructions or the like are input, and a storage unit 122 in which computer programs and data are stored.

The stage 116 has a mechanism for movement in the following directions: horizontal (X axis), vertical (Y axis), height (Z axis), rotation (R axis), and tilt (T axis). By attaching the sample table 103 on which the sample is disposed to the stage 116, the desired portion for observation of the sample 102 can be observed by tilting to a desired angle for observation. In the present embodiment, the stage 116 has a mechanism for movement in at least the tilt (T axis) direction. An infrared camera 120 for preventing contact between the stage 116 and the detector 101 when analyzing by tilting the sample 102 is also provided.

With regard to the attachment position of the infrared camera 120, the infrared camera 120 is attached in a direction from which contact between the stage 116 and the detector 101 can be confirmed. An image from the infrared camera 120 can be confirmed on the display device 117, and can be displayed automatically at the time of imaging or displayed manually by a user.

Next, a technology (comparative embodiment) that differs from the present embodiment will be explained in detail with a focus on its disadvantages compared to the present embodiment.

In a charged particle beam device that differs from the present embodiment, when analyzing using an EBSD detector, it is extremely difficult to adjust a desired portion of the sample to the analysis position of the EBSD detector. This is because, when analyzing the sample by EBSD detection, it is necessary to significantly tilt the sample before analysis, and thus the sample may escape from the field of view due to this tilting.

Further, in the comparative embodiment, whether or not a portion to be observed can be adjusted to an observation position of the EBSD detector cannot be determined until after the sample is tilted and the X axis, Y axis, Z axis, and R axis are adjusted while confirming the charged particle image.

In addition, in the comparative embodiment, in the case that the desired portion could not reach the analysis position of the EBSD detector, the sample table must be removed from the vacuum chamber of the charged particle beam device to modify the mounting position of the sample on the sample table, and then the sample table must be reattached inside the vacuum chamber. Therefore, when analyzing with an EBSD detector, it can take an enormous amount of time to adjust the desired portion of the sample to the analysis position.

Therein, by using a sample holder that can mount the sample in a state in which it is tilted beforehand for analysis by an EBSD detector, situations in which the sample escapes from the field of view due to tilting can be prevented. However, there is a risk that the tilting part of the sample holder may contact the detector when rotated around the R axis due to the special shape of such a sample holder, and thus the movable region around the R axis is greatly reduced. Therefore, in the comparative embodiment, it is difficult to adjust the analysis portion of the sample.

One reason for the disadvantages in the comparative embodiment described above is that the analysis position cannot be easily ascertained when tilting the sample.

In addition to the above reason, although the analyzable range can be expanded upon adding a rotation operation via the R axis when analyzing the sample, it cannot be directly understood how far is analyzable, and thus the analysis position must be adjusted several times and this adjustment may take time.

As described above, in the comparative embodiment, it is difficult to easily grasp the analyzable range when tilting the sample, and thus the device is difficult to use and adjusting the analysis portion of the sample to the desired position requires an enormous amount of time.

The present embodiment can eliminate the above-described disadvantages of the comparative embodiment.

Figure 2:
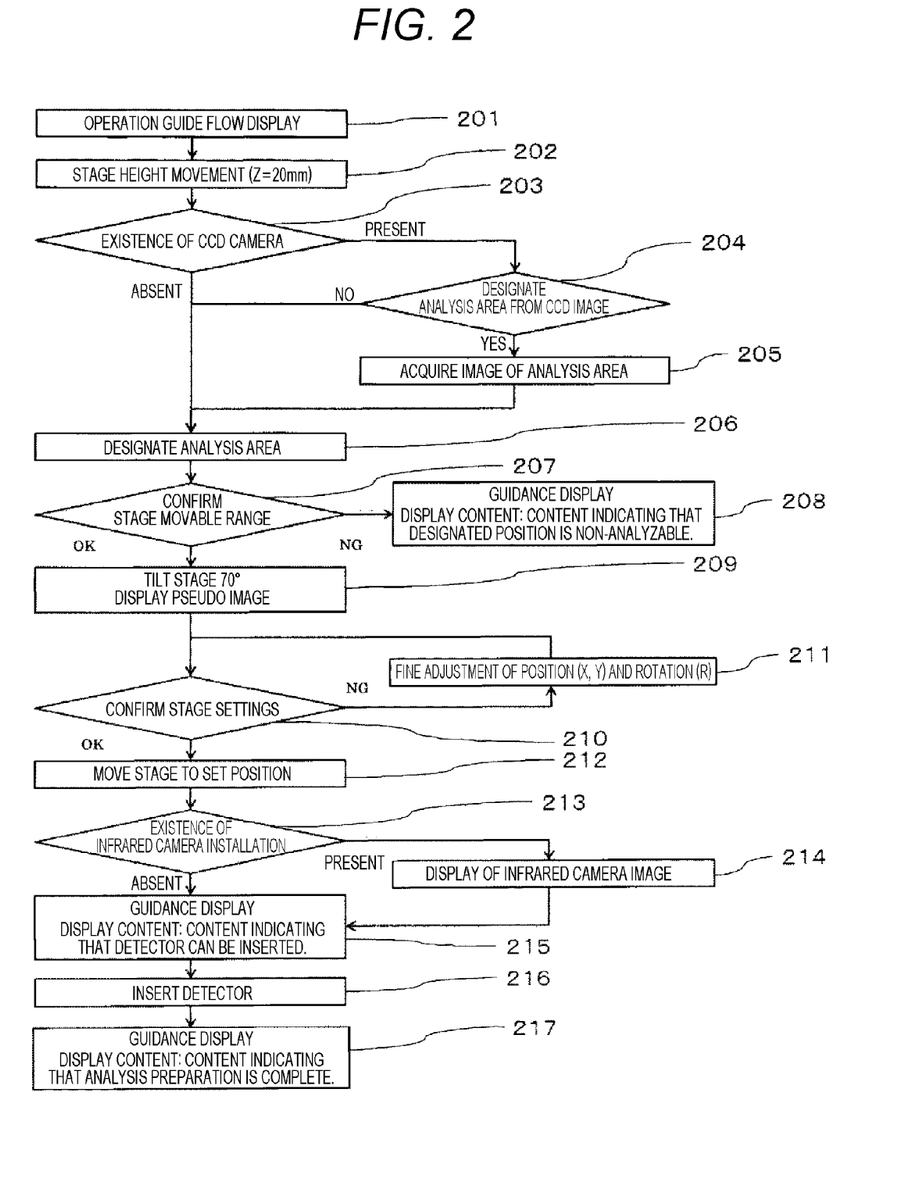
FIG. 2 is a flowchart illustrating a processing flow until sample observation in an embodiment.

FIG. 2 is a basic processing flowchart until sample analysis by the EBSD detector in the present embodiment. Therein, the sample is already disposed within the vacuum chamber 107. Further, the sample position adjustment method in the charged particle beam device to be explained later can be executed by a computer program stored in the storage unit 122 connected to the control computer 118.

Figure 3:
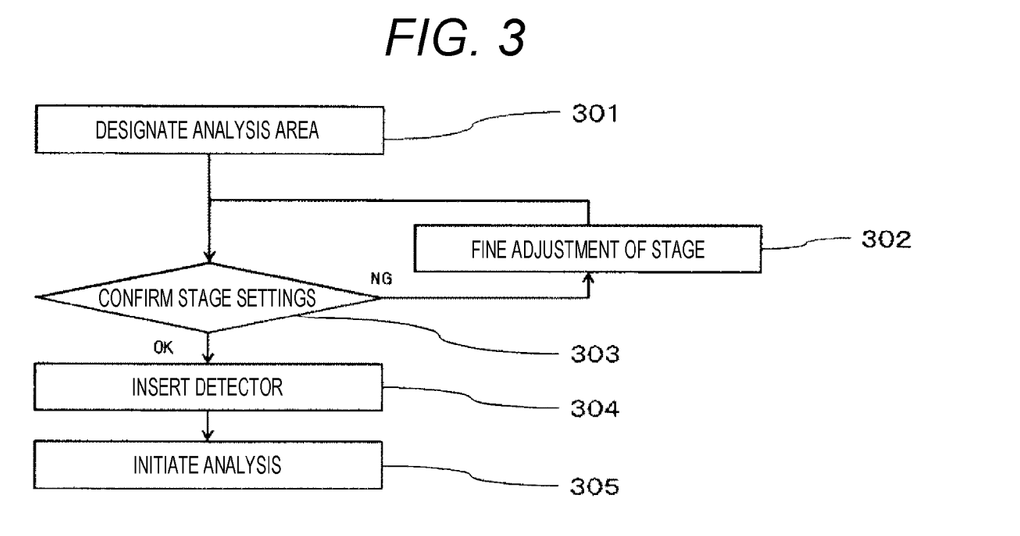
FIG. 3 is a flowchart illustrating a processing flow until sample observation performed by a user in the embodiment.

In FIG. 2, first, a guide flow regarding the operation by a user is displayed on a display (step 201). FIG. 3 illustrates this guide flow (overall operation flow). The user can easily analyze the desired sample position by executing operations in accordance with the guide flow. In FIG. 3, from a state in which the sample 102 is mounted in the vacuum chamber 107, the user designates, with the operation input unit 121, a desired analysis position from an analysis area displayed on the image display device 117 (step 301). Next, a pseudo image is displayed based on information of the position of the stage 116 that has been set, and it is confirmed whether the setting of the stage 116 is at the desired analysis position or is the pseudo image (step 303). If necessary, the stage position (X axis, Y axis, R axis) can be more finely adjusted by the operation input unit 121 (step 302). Once the setting is complete and the stage position is established, movement of the stage 116 is initiated.

Once the movement of the stage 116 has completed, the detector 101 is inserted (step 304), and analysis by the EBSD detector 101 is initiated (step 305).

By following the flowchart shown in FIG. 3, the stage 116 can be easily adjusted in a short amount of time during EBSD analysis.

The flow shown in FIG. 2 is a portion of the flow shown in FIG. 3, and is a preparatory operation for setting the position of the sample.

Next, in FIG. 2, the Z axis of the stage 116 is automatically moved to a height of 20 mm (step 202). At this height, the stage 116 and an aperture member do not contact each other even if the stage 116 is tilted to a maximum of 70 degrees. Depending on the relationship between the stage 116 and the aperture member, the height does not necessarily have to be 20 mm, and can be any height at which the stage 116 and the aperture member do not contact each other.

Next, the existence of a CCD camera 119 image is confirmed (step 203). If it is confirmed that a CCD camera 119 image exists, a confirmation regarding whether analysis is to be carried out using the image obtained by the CCD camera 119 is displayed on the display device 117 (step 204). In step 204, if the CCD image is to be used, an image of the sample used for analysis is acquired (step 205). At this time, it is preferable to acquire a planar image of the entire sample. The process then proceeds to step 206. In step 204, if the analysis area is not designated from the CCD image, the process proceeds to step 206.

In step 206, an area to be analyzed is designated. Designation of the analysis area is carried out by an operator (user) with the pseudo image displayed on the display device 117. The pseudo image is generated by processing in the control computer 118 based on information of the sample table 103 set by the user. If a CCD image is acquired in step 205, this image is used.

Figure 4:
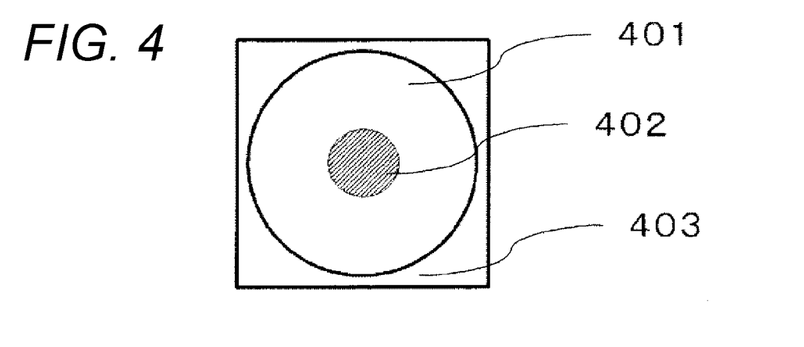
FIG. 4 is a schematic view of an input unit with which a user instructs an observation target portion of a sample in the embodiment.

In step 206, a region on the acquired image that is non-analyzable due to tilting of the sample 102 is calculated, composite processing with the pseudo image is executed, and a composite image is displayed on the display device 117. FIG. 4 is an example of such a composite image to be displayed.

In FIG. 4, a stage movable range display 401, a hatched region display 402 that displays a region which is non-analyzable due to tilting of the stage, and a display 403 which is outside of the stage movable range are displayed as the composite image. Normally, when the stage 116 is rotated, the analyzable range can be expanded. Therefore, the stage movable range 401 is displayed considering an analysis range that is expanded when the stage 116 is rotated beforehand. Thereby, the analysis range that will be expanded upon rotation of the stage 116 can be understood in advance, and this is convenient and contributes to the ease of use.

When the stage 116 is tilted, normally, if the center of the rotation axis of the stage 116 and the irradiation axis of the charged particle beam 104 do not match, the region near the center of the stage 116 becomes non-analyzable. This region is circular since rotation of the stage 116 is taken into consideration.

When the composite image shown in FIG. 4 is displayed, a region that becomes non-analyzable due to tilting of the stage 116 can be understood in advance. Thus, it is not necessary to confirm whether a region can be analyzed by tilting the stage 116, and this is convenient and contributes to the ease of use. Further, the analyzable region can be understood without actually moving the stage 116, and thus there is no contact between the stage 116 and the aperture member and the safety can be ensured.

In step 206 of FIG. 2, expansion of the analyzable range by rotation of the R axis is also taken into consideration. The region that becomes non-analyzable can be calculated from the size of the sample table 103 to be used, the tilt angle of the sample 102, the axial position of the rotation of the stage 116, and the irradiation position of the charged particle beam 104. This region is calculated with an arithmetic processing unit within the control computer 118. For example, a conversion table can be prepared in advance, or the region can be calculated every time by using a conversion equation. Since this operation can be executed with a simple conversion equation, the amount of operation is low even when calculating the region every time. The user sets the position (X axis direction, Y axis direction) of the stage 116 with the operation input unit 121 while viewing the composite image displayed on the display device 117.

Next, it is determined by the arithmetic processing unit within the control computer 118 whether the stage 116 can move to the position (X axis direction, Y axis direction) of the stage 116 set by the user by combining planar movement or rotational movement of the stage 116 (step 207). If it is determined that movement of the stage 116 is not possible in step 207, a guidance indicating that movement of the stage to the set position is impossible is displayed on the display device 117, and the guide flow terminates (step 208). The guide flow terminates in the example of FIG. 2, but the flow can also return to designating the analysis area again after displaying the guidance indicating that the setting is impossible.

The operation input unit refers generally to a means, such as a mouse, for input with which a user instructs a state of the sample table 103 and a position to be analyzed. However, the operation input unit can also include a touch panel of the display device 117.

If stage movement is possible in step 207, the pseudo image of the sample stage 116 is displayed on the display device 117 according to the position (X axis direction, Y axis direction), the rotational angle (R direction), and the tilt angle (T direction) of the stage 116 set by the user (step 209).

Figure 5:
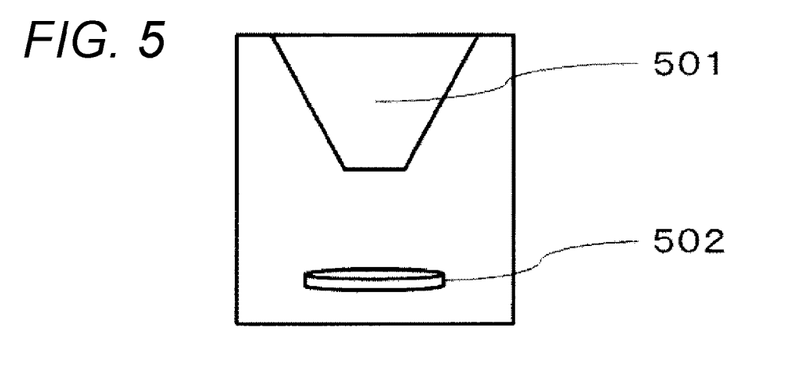
FIG. 5 shows an example of a pseudo image illustrating a positional relationship between an aperture member and a sample table in the embodiment.
Figure 6:
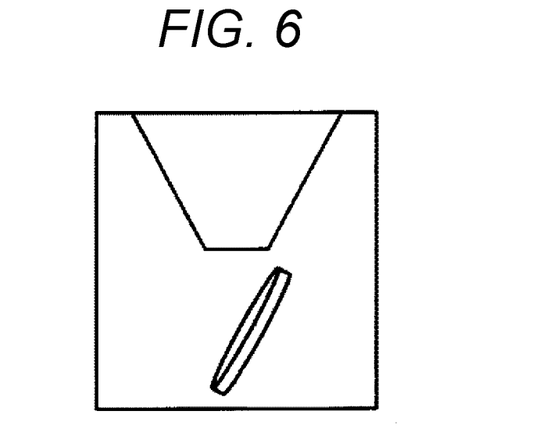
FIG. 6 shows an example of a pseudo image illustrating a positional relationship when the sample table has moved from the state shown in FIG. 5.
Figure 7:
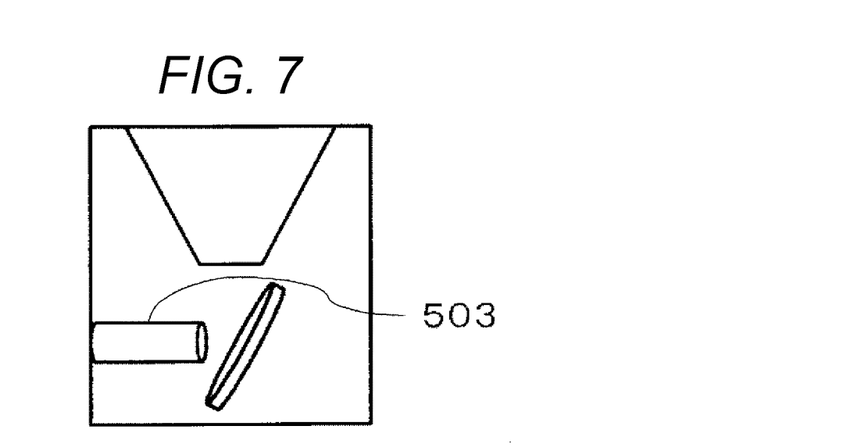
FIG. 7 shows an example of a pseudo image when a detector has been inserted into the state shown in FIG. 6.

At this time, as shown in FIGS. 5, 6, and 7, by displaying the course of operation of the stage 116, a user can confirm the movement of the sample (step 210).

FIGS. 5, 6, and 7 illustrate examples of pseudo images from a viewpoint enabling confirmation of the positional relationship between a sample table 502 (103) of the stage 116 and an aperture member 501 and detector 503 (101).

FIG. 5 is an image illustrating the positional relationship between the sample table 502 of the stage 116 before tilting and the aperture member 501. By displaying the sample table 502 as it changes gradually from the state shown in FIG. 5 to the tilted state shown in FIG. 6, the state when tilting the sample can be intuitively understood. Further, when the sample table 502 has been tilted to near vertical, the user can understand that the aperture member 501 and the sample table 502 will not contact each other, and thus breakdowns of the device or scratches on the sample caused by such contact can be avoided, and the device is safe and convenient. Normally, the distance between the aperture member 501 and the sample on the sample table 502 is several mm, and thus sufficient care is necessary given this close distance.

FIG. 7 illustrates the positional relationship among the sample table 502 of the stage 116 after tilting, the aperture member 501, and the detector 503 that has been inserted. From the image shown in FIG. 7, the positional relationship between the sample table 502 of the stage 116 that has been tilted and the detector 503 that has been inserted can be intuitively envisioned. Since the analysis precision improves the closer the sample and the EBSD detector 503 are brought together, if an image thereof is displayed as in FIG. 7, the operator can confidently perform the operation of bringing the two together, and this adds to the convenience of the device. Further, since the operator can intuitively see that the detector 503 has been inserted, damage from contact between the detector 503 and the sample due to an operation error can be eliminated, and this improves the safety of the device.

In step 210 of FIG. 2, if it is determined that positional adjustment of the stage 116 is necessary, the user can finely adjust the position (X axis direction, Y axis direction) and rotational angle (R direction) of the stage while looking at the pseudo image (step 211). The operability can be further enhanced by enabling the position (X axis direction, Y axis direction) and rotational angle (R direction) of the stage to be set by manipulating the state of the image of the sample table displayed in the pseudo image, such as by dragging the pseudo image directly with a mouse or the like. Also, switching the viewpoint and zooming in and out can also be made possible. If the display device 117 is a touch panel, this can be used instead of the operation using the operation input unit 121 such as a mouse.

Next, the stage 116 is moved to the position (X axis direction, Y axis direction), rotational angle (R direction), and tilt angle (T direction) of the stage that was set in step 210 (step 212). At this time, the pseudo image (FIG. 5) illustrating the positional relationship between the aperture member and the stage 116 when viewing the stage 116 from the horizontal direction (ZT direction) displays the stage gradually tilting to the state shown in FIG. 6 in accordance with the movement of the tilt angle (T direction) of the stage 116.

At this time, it is determined whether the infrared camera 120 that can capture the relationship between the stage 116 and the aperture member within the vacuum chamber 107 has been installed (step 213). If the infrared camera 120 has been installed, the image captured by the infrared camera can be displayed on the display device 117 instead of the pseudo image shown in FIGS. 5 and 6 (step 214).

For switching between the pseudo image and the infrared camera image, a mechanism for detecting the existence of camera installation can be provided and the switching can be carried out automatically by detecting a camera installation signal, or a confirmation for use of the camera image can be displayed on the display device 117 and the switching can be carried out by a manual setting by a user operation.

Depending on the movement position of the stage 116, the tilt axis and scan direction may differ due to the relationship between the tilt direction of the stage 116 and the position of the detector 101. Therefore, it may be impossible to focus because the distance between the electron gun 111 and the sample 102 differs at the upper side and the lower side of the sample 102. Thus, in order to enable the clearest observation, the scanning direction is automatically rotated by raster rotation so that the tilt axis direction and the scanning direction become parallel.

Next, once the movement of the stage 116 has completed, a guidance indicating that the detector 101 can be inserted is displayed on the display device 117 (step 215). An insertion operation of the detector 101 is then performed by a user operation according to the displayed guidance (step 216). At this time, the positional relationship among the stage 116, the aperture member, and the detector 101 is displayed with a pseudo image (FIG. 7). The pseudo image at this time can also be replaced with the camera image similar to step 213.

Finally, a guidance indicating completion of measurement preparation of the EBSD detector 101 is displayed, and observation is initiated by scanning over the sample with the primary charged particle beam 104 (step 217).

According to the constitution of the embodiment explained above, analysis with the EBSD detector 101 can be carried out without worrying about the sample escaping from the observation field due to tilting of the stage 116 or contact between the detector 101 and the stage 116 or the aperture member. Further, the user can grasp the movable range of the stage 116 beforehand using the pseudo image, and the desired position can be easily observed without any trouble of searching for the desired observation field. Thus, a charged particle beam device and a sample position adjustment method that are convenient and easy to use can be realized.

In addition, a computer program that executes the above-mentioned sample position adjustment method can be realized.

A region that would become non-analyzable due to tilting of the stage 116 can also be understood in advance, and thus it is not necessary to confirm whether a region can be analyzed by tilting the stage 116. Therefore, a charged particle beam device that is convenient and easy to use can be realized.

The analyzable region can be understood without actually moving the stage 116, and thus there is no contact between the stage 116 and the aperture member and the safety can be ensured.

Further, the positional relationship among the stage 116, the aperture member, and the detector 101 that has been inserted after tilting the stage 116 can be intuitively envisioned. Therefore, when the sample table 103 has been tilted to near vertical, the user can understand that the aperture member and the sample table 103 will not contact each other, and thus breakdowns of the device or scratches on the sample caused by such contact can be avoided, and the device is safe and convenient. Also, damage from contact between the detector 101 and the sample 102 due to an operation error can be eliminated, and this improves the safety of the device.

The present invention is not limited to the above-described embodiments, and various alternative embodiments are included therein.

For example, the above embodiments were explained in detail in order to facilitate the understanding of the present invention, and the present invention is not necessarily limited to including every constitution explained above.

Further, some of the constitutions of a certain embodiment can be substituted for constitutions of another embodiment, and the constitutions of a certain embodiment can be added to the constitutions of another embodiment. Also, some of the constitutions of the embodiments can be added, deleted, or substituted with other constitutions. In addition, some or all of the constitutions, functions, processing units, processing means and the like explained above can be realized with hardware by, for example, designing an integrated circuit or the like.

The above constitutions, functions and the like can also be realized by software by interpreting and executing, with a processor, a program that executes the functions. Information of the programs, tables, files and the like that execute the functions can be placed in a storage device such as a memory, a hard disk, or a solid state drive (SSD), or a storage medium such as an IC card, an SD card, or a DVD.

The control lines and information lines which are indicated above are those believed to be necessary for the explanation, and all of the control lines and information lines in the article are not necessarily indicated above. It should be understood that almost all of the constitutions are actually mutually connected to each other.

Instead of or together with the detector or aperture member, other members included in the charged particle beam optical system can be displayed with the pseudo image. Further, rather than displaying all of the detector, the aperture, and the members included in the charged particle beam optical system, only a portion of these members can be displayed.

When these members are not included in the field of view of the pseudo image, arrow marks or the like indicating the direction of the detector can be displayed with the pseudo image.

REFERENCE SIGNS LIST 101, 503 EBSD detector
102 sample
103, 502 sample table
104 primary charged particle beam
105 reflected electrons
107 vacuum chamber
111 electron gun
112 condenser lens
113 deflector
114 objective lens
115 charged particle optical system
116 sample stage
117 display device
118 control computer
119 CCD camera
120 infrared camera
121 operation input unit
122 storage unit
401 stage movable range
402 region which is non-observable due to tilting 403 outside of stage movable range
501 aperture member

The invention claimed is:
1. A charged particle beam device comprising:
a charged particle source that emits a charged particle beam;
a charged particle optical system that irradiates the charged particle beam on a sample;
an EBSD detector that detects backscattered electron diffraction generated from a surface of the sample by irradiation of the charged particle beam;
a sample stage that supports and moves a sample table on which the sample is disposed;
an image display unit that displays a portion in the sample that is analyzable by the EBSD detector and a portion that is non-analyzable such that the portions are distinguishable;
a user interface with which a position to be analyzed by the EBSD detector is input; and
a computer programmed to control a planar movement, a tilt movement, and a rotational movement of the sample stage so as to allow the analysis position input from the user interface to be analyzed by the EBSD detector.

2. The charged particle beam device according to claim 1, wherein
the image display unit is configured to display a portion that is non-analyzable by the EBSD detector due to tilt movement of the sample stage and a portion that is non-analyzable by the EBSD detector due to being outside a movement range of the sample stage such that the portions are distinguishable.

3. The charged particle beam device according to claim 1, wherein
the image display unit is configured to indicate that analysis by the EBSD detector is not possible when the analysis position input from the user interface is a portion that is non-analyzable by the EBSD detector.

4. The charged particle beam device according to claim 1, wherein
the image display unit is configured to indicate that the EBSD detector can be inserted after the sample stage has moved so as to allow analysis by the EBSD detector.

5. The charged particle beam device according to claim 1, wherein
the charged particle beam device comprises an imaging device that images the sample, and the image display unit combines and displays the analyzable portion and the non-analyzable portion with an image obtained by the imaging device.

6. The charged particle beam device according to claim 1, wherein
the computer is programmed to generate a pseudo image based on information stored in a sample table, and
the image display unit is configured to display, before movement of the sample stage, the pseudo image showing a case in which the sample stage has been moved in accordance with the analysis position input from the user interface.

7. The charged particle beam device according to claim 6, wherein
the image display unit is configured to display a positional relationship among the charged particle beam optical system, the EBSD detector, and the sample table in the pseudo image.

8. The charged particle beam device according to claim 6, wherein
the user interface is configured to allow for readjustment of the analysis position after the pseudo image has been displayed on the image display unit.

9. The charged particle beam device according to claim 6, wherein
the charged particle beam device comprises an imaging device that images the sample, and
the image display unit combines and displays an image obtained by the imaging device with the pseudo image.

10. A charged particle beam device comprising:
a charged particle source that emits a charged particle beam;
a charged particle optical system that irradiates the charged particle beam on a sample;
an EBSD detector that detects backscattered electron diffraction generated from a surface of the sample by irradiation of the charged particle beam;
a sample stage that supports and moves a sample table on which the sample is disposed;
a user interface with which a position to be analyzed by the EBSD detector is input;
a computer programmed to control a planar movement, a tilt movement, and a rotational movement of the sample stage so as to allow the analysis position input from the user interface to be analyzed by the EBSD detector when the analysis position is a portion that is analyzable by the EBSD detector; and
an image display unit that displays that analysis by the EBSD detector is not possible when the analysis position input from the user interface is a portion that is non-analyzable by the EBSD detector.

11. The charged particle beam device according to claim 10, wherein
the image display unit is configured to display a portion that is non-analyzable by the EBSD detector due to tilt movement of the sample stage and a portion that is non-analyzable by the EBSD detector due to being outside a movement range of the sample stage such that the portions are distinguishable.

12. The charged particle beam device according to claim 10, wherein
the image display unit is configured to indicate that the EBSD detector can be inserted after the sample stage has moved so as to allow analysis by the EBSD detector.

13. The charged particle beam device according to claim 10, wherein
the charged particle beam device comprises an imaging device that images the sample, and
the image display unit combines and displays the analyzable portion and the non-analyzable portion with an image obtained by the imaging device.

14. The charged particle beam device according to claim 10, wherein
the computer is programmed to generate a pseudo image based on information stored in a sample table, and
the image display unit is configured to display, before movement of the sample stage, the pseudo image showing a case in which the sample stage has been moved in accordance with the analysis position input from the user interface.

15. The charged particle beam device according to claim 14, wherein the image display unit is configured to display a positional relationship among the charged particle beam optical system, the EBSD detector, and the sample table in the pseudo image.

16. The charged particle beam device according to claim 14, wherein
the user interface is configured to allow for readjustment of the analysis position after the pseudo image has been displayed on the image display unit.

17. The charged particle beam device according to claim 14, wherein
the charged particle beam device comprises an imaging device that images the sample, and
the image display unit combines and displays an image obtained by the imaging device with the pseudo image.

18. A method for controlling a charged particle beam device that guides attachment of an EBSD detector to the charged particle beam device, the method comprising:
calculating, by a computer programmed to calculate, a portion that is analyzable in a sample disposed on a sample table by the EBSD detector and a portion that is non-analyzable based on a size of the sample table supported on a sample stage, a tilt angle of the sample stage during use of the EBSD detector, and a range of planar movement, tilt movement, and rotational movement of the sample stage;
controlling, by the computer which is programmed to control, the planar movement, tilt movement, and rotational movement of the sample stage so as to allow a position for analysis by the EBSD detector input from a user interface to be analyzed by the EBSD detector when the analysis position is the analyzable portion; and
displaying that the EBSD detector can be inserted on an image display unit after the planar movement, tilt movement, and rotational movement of the sample stage so as to allow the analysis position to be analyzed by the EBSD detector.

19. The method for controlling a charged particle beam device according to claim 18, wherein
a portion in the sample that is analyzable by the EBSD detector and a portion that is non-analyzable are displayed on the image display unit such that the portions are distinguishable.

20. The method for controlling a charged particle beam device according to claim 19, wherein
a portion that is non-analyzable by the EBSD detector due to tilt movement of the sample stage and a portion that is non-analyzable by the EBSD detector due to being outside a movement range of the sample stage are displayed on the image display unit such that the portions are distinguishable.

21. The method for controlling a charged particle beam device according to claim 18, wherein
it is displayed on the image display unit that analysis by the EBSD detector is not possible when the analysis position input from the user interface is a portion that is non-analyzable by the EBSD detector.

22. The method for controlling a charged particle beam device according to claim 18, wherein
the analyzable portion and the non-analyzable portion are combined with an image obtained by an imaging device and displayed on the image display unit.

23. The method for controlling a charged particle beam device according to claim 18, further comprising:
generating, by the computer programmed to generate, a pseudo image based on information stored in a sample table, the pseudo image showing, before movement of the sample stage, a case in which the sample stage has been moved in accordance with the analysis position input from the user interface, and
displaying the pseudo image on the image display unit.

24. The method for controlling a charged particle beam device according to claim 23, wherein
a positional relationship among the charged particle beam optical system, the EBSD detector, and the sample table is displayed in the pseudo image.

25. The method for controlling a charged particle beam device according to claim 23, wherein
a position to be analyzed by the EBSD detector can be re-input from the user interface after the pseudo image has been displayed on the image display unit.

* * * * *